(12) United States Patent
Wang et al.

(10) Patent No.: US 6,803,310 B2
(45) Date of Patent: Oct. 12, 2004

(54) METHOD FOR FORMING A PLUG METAL LAYER

(75) Inventors: Yu-Piao Wang, Chu-Pei (TW); Chia-Che Chuang, Tainan (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/376,309

(22) Filed: Mar. 3, 2003

(65) Prior Publication Data

US 2003/0190802 A1 Oct. 9, 2003

Related U.S. Application Data

(62) Division of application No. 09/884,799, filed on Jun. 19, 2001, now Pat. No. 6,686,278.

(51) Int. Cl.$^7$ ............................................... H01L 21/44
(52) U.S. Cl. ........................................ 438/672; 438/681
(58) Field of Search ........................ 438/627–629, 438/637–638, 643–644, 653–654, 674–675, 678–681, 687

(56) References Cited

U.S. PATENT DOCUMENTS

| | | | |
|---|---|---|---|
| 6,016,009 A | * | 1/2000 | Sukharev et al. ............ 257/763 |
| 6,271,136 B1 | * | 8/2001 | Shue et al. .................. 438/687 |
| 6,368,954 B1 | * | 4/2002 | Lopatin et al. .............. 438/627 |

* cited by examiner

*Primary Examiner*—David Nelms
*Assistant Examiner*—David Vu
(74) *Attorney, Agent, or Firm*—Dickinson Wright PLLC

(57) ABSTRACT

Perform an atomic layer deposition (ALD) at least once to form a continuous metal seed layer (CMSL) on the barrier layer, wherein the atomic layer deposition comprises: a mixing gas of hydrogen and silane, such as hydroxy silane or tetrahydroxy silane, is transported on the barrier layer; next, perform a purge/vacuum process; then a reactive gas, such as $WF_6$, is transported to form the continuous metal seed layer (CMSL); the cycle step of the atomic layer deposition (ALD) can be repeated to form the thickness of the continuous metal seed layer (CMSL) about 20 to 40 Å.

10 Claims, 10 Drawing Sheets

METHOD FOR FORMING A PLUG METAL LAYER

This is a division of U.S. patent application Ser. No. 09/884,799, filed Jun. 19, 2001 now U.S. Pat No. 6,686,278.

BACKGROUND OF THE INVENTION

1. Field of the Invention

The present invention relates generally to a method for forming a plug metal layer, and in particular to a method for forming the plug tungsten (W) layer.

2. Description of the Prior Art

As semiconductor devices, such as Metal-Oxide-Semiconductor devices, become highly integrated the area occupied by the device shrinks, as well as the design rule. With advances in semiconductor technology, the dimensions of the integrated circuit (IC) devices have shrunk to the deep sub-micron range. When the semiconductor device continuously shrinks to the deep sub-micron region, some problems described below are incurred due to the scaling down process.

Generally known in the art of integrated circuit fabrication is the use of titanium nitride layers. Titanium nitride layers within integrated circuit fabrication are most commonly employed as either barrier layers or adhesion promoter layers. When employed as barrier layers, titanium nitride layers are typically formed interposed between a conductor metallization layer and a doped silicon layer or a doped silicon semiconductor substrate. When formed in this location, a titanium nitride layer provides a barrier to inhomogeneous inter-diffusion and spiking from the conductor metallization layer into the doped silicon layer or the doped silicon semiconductor substrate. Titanium nitride layers, which are employed as barrier layers, are particularly well evolved within integrated circuit fabrication. Alternatively, when employed as adhesion promoter layers, titanium nitride layers within integrated circuits are typically formed as liner layers beneath blanket tungsten layers from which in turn are formed conductive contact and interconnection studs through patterned dielectric layers within those integrated circuits.

While the barrier layer characteristics of titanium nitride layers have made titanium nitride layers quite common within integrated circuit fabrication, methods through which such titanium nitride layers may be formed within integrated circuits are not entirely without problems. In particular, within the titanium nitride layers the integrated circuit device dimensions have decreased, and the aspect ratios of apertures have increased within those integrated circuits. It has become increasingly difficult to form, through conventional physical vapor deposition (PVD) sputtering methods, titanium nitride layers with adequate step coverage. The difficulty derives from the inherent line-of-sight deposition characteristics of conventional physical vapor deposition (PVD) sputtering methods employed in forming integrated circuit layers of titanium nitride, as well as other materials. The line-of-sight deposition characteristics typically provide only limited sidewall and bottom coverage of titanium nitride within a narrow high aspect ratio aperture (i.e., an aperture of width less than about 0.5 microns and aspect ratio greater than about 3). Titanium nitride layer which is desired in comparison with titanium nitride coverage upon the surface of the integrated circuit layer (typically a dielectric layer) within which is formed the aperture.

In response to the step coverage limitations inherent in forming titanium nitride layers through physical vapor deposition (PVD) sputtering methods, there has alternatively been proposed and disclosed the use of chemical vapor deposition (CVD) methods for forming titanium nitride layers within integrated circuits. Titanium nitride layers formed through chemical vapor deposition (CVD) methods have inherently superior step coverage within narrow high aspect ratio apertures within integrated circuits since chemical vapor deposition (CVD) methods, in general, proceed through a surface diffusion deposition phenomenon rather than a line-of-sight deposition phenomenon.

Although chemical vapor deposition (CVD) methods may be employed within integrated circuits to provide titanium nitride layers with superior step coverage for narrow high aspect ratio apertures. Chemical vapor deposition (CVD) methods are also not entirely without problems when forming titanium nitride layers within integrated circuits with optimally desirable properties. In that regard, it is difficult to deposit titanium nitride layers at comparatively low temperatures (i.e., less than a temperature of about 550 degrees centigrade at which aluminum-containing conductor metallization layers deteriorate) through low pressure chemical vapor deposition (LPCVD) methods. Simultaneously, it is also difficult to deposit titanium nitride layers with a low resistivity and impurity concentration through metal organic chemical vapor deposition (MOCVD) methods. Particularly undesirable impurities formed within titanium nitride layers deposited through metal organic chemical vapor deposition (MOCVD) methods are carbon, oxygen, and hydrogen. These impurities increase the difficulty of the subsequent process, for example, a gap-filling process.

In general, a titanium layer and a titanium nitride layer are first formed to provide a barrier layer in the process for forming a plug tungsten layer. Next, the titanium nitride layer is treated by way of using a plasma process, and then the tungsten process is performed. Nevertheless, there is the directional issue when the conventional plasma process for the treatment of the barrier layer is used to treat the surface of the barrier layer in the via hole. That is, the treatment of the conventional plasma process cannot overall suffuse the barrier layer and, hence, the treatment of the titanium nitride layer on the sidewall of the via hole is incomplete. Furthermore, if the titanium nitride layer is formed by way of metal organic chemical vapor deposition (MOCVD), the titanium nitride layer on the sidewall of the via hole without plasma will have residual volatility solvent therein, therefore causing "out-gassing".

The issues above result from the most commonly used precursors for metal organic chemical vapor deposition (MOCVD) are TDMAT and TDEAT, which might end up with a TiN layer having carbon and/or hydrogen byproducts after a thermal dissociation process. A conventional method used in solving the above problem is by the use of nitrogen ($N_2$) and/or hydrogen ($H_2$) plasma treatment to reduce the byproduct content within the TiN layer, as well as by reducing its resistivity and water absorption.

Nevertheless, anisotropic plasma treatment against deeper trenches, that is, trenches having high aspect ratios, cannot effectively remove the residing byproducts in the sidewalls of the via/contact holes. Thus, the byproduct contents at the sidewall and at the top of the via/contact holes are very different, which result in different metal deposition rates over the treated/untreated TiN barrier layer at later stages, that is, selectivity of the metal chemical vapor deposition. As shown in FIG. 1, the selectivity of the metal chemical vapor deposition is a ratio of the thickness of the metal nucleation, wherein the ratio (b/a) is the thickness of the metal nucleation on the top of the via hole (with the treatment of plasma) and the sidewall of the via hole (without the treatment of plasma). In the conventional process for the metal chemical vapor deposition, the ratio of b to a is about 40 to 60% or 50 to 70% that is due to the fact that the sidewall of the via hole cannot be treated with the plasma process and, hence, resulting in uncontinuous and insufficient nucleation sites.

In such instance, the side-wall deposition rate is less than the top deposition rate, as the plug metal is laid down, it tends to cover the via/contact holes before the metal layer covering the opposite sides of the holes meets. This forms an open area in the holes resulting in what is known as a "seam" phenomena. When the plug metal layer etch back is performed, the void is opened, which forms an irregular upper surface on the metal plug in the well. It is very difficult to form a good contact between the irregular upper surface of the open via/contact plug and the interconnect line. Metal applied to such irregular surfaces tends to crack or break over time, such as over-high resistance constant (RC), which can cause a defective integrated circuit and can create major reliability problems. This is especially true for device generation smaller than 0.18 micrometer, where the process integration is very difficult owing to the resistance constant (RC) being too high and, hence, unstable.

In accordance with the above description, a new and improved method for forming a plug metal layer is therefore necessary so as to raise the yield and quality of the follow-up process.

SUMMARY OF THE INVENTION

In accordance with the present invention, a method is provided for forming a plug metal layer that substantially overcomes the drawbacks of the above-mentioned problems that arise from conventional methods.

Accordingly, it is a main object of the present invention to provide a method for forming a plug metal layer. This invention can perform the cycle step of an atomic layer deposition (ALD) to form a continuous metal seed layer (CMSL), so as to raise the selectivity of the metal. Furthermore, the steps of the atomic layer deposition (ALD) of the present invention is to individually transport the reactive gas in order to prevent the issue of the competitive adsorption, whereby a thin continuous metal seed layer (CMSL) with continuous and densely nucleation sites is formed. The thickness of the continuous metal seed layer (CMSL) is only about 20 to 40 Å, wherein the thin continuous metal seed layer (CMSL) can substitute for the thick nucleation layer that is about more than 500Å. It is necessary to be formed in the conventional process, because the nucleation sites are insufficient. Moreover, the continuous metal seed layer (CMSL) also can be reformed before the nucleation layer is formed to reduce the thickness of the nucleation layer that can make for a better gap-filling process. Therefore, the present invention makes cost reductions that correspond to a positive economic effect that are appropriate for deep sub-micron technology.

In accordance with the present invention, a new process for forming a plug metal layer is disclosed. First of all, a semiconductor substrate is provided. Then a dielectric layer is deposited on the semiconductor substrate. Next, a photoresist layer is formed and defined on the dielectric layer. An etching process is then performed by the photoresist layer as an etched mask to form a via hole. After removing the photoresist layer, a barrier layer on the dielectric layer and the sidewall and bottom of the via hole is formed. Afterward, the barrier layer is treated by way of a plasma process. Subsequently, the formation of an atomic layer deposition (ALD) at least once is performed to form a continuous metal seed layer (CMSL) on the barrier layer, wherein the atomic layer deposition comprises: a mixing gas of hydrogen and silane, such as hydroxy silane or tetrahydroxy silane, is transported on the barrier layer; next, perform a purge/vacuum process; then a reactive gas, such as $WF_6$, is transported to form the continuous metal seed layer (CMSL); the cycle step of the atomic layer deposition (ALD) can be repeated to form the thickness of the continuous metal seed layer (CMSL) about 20 to 40 Å. Then a nucleation layer is formed on the continuous metal seed layer (CMSL). Afterward, a blanket metal layer is formed on the nucleation layer. Finally, the blanket metal layer is etched back by way of a chemical mechanical polishing process (CMP) and a plug metal layer is formed on the via hole.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4A to FIG. 4F show cross-sectional views illustrative of various stages for forming the plug metal layer by way of a continuous metal seed layer (CMSL) in accordance with the third embodiment of the present invention, wherein FIG. 4C shows a flowchart of the atomic layer deposition (ALD); and FIG. 5A to FIG. 5F show cross-sectional views illustrative of various stages for forming the plug tungsten layer by way of a continuous tungsten seed layer (CWSL) in accordance with the fourth embodiment of the present invention, wherein FIG. 5C shows a flowchart of the atomic layer deposition (ALD).

DESCRIPTION OF THE PREFERRED EMBODIMENT

Preferred embodiments of the present invention will now be described in greater detail. Nevertheless, it should be recognized that the present invention can be practiced in a wide range of embodiments besides those explicitly described, and the scope of the present invention is expressly not limited except as specified in the accompanying claims.

Figure 1:
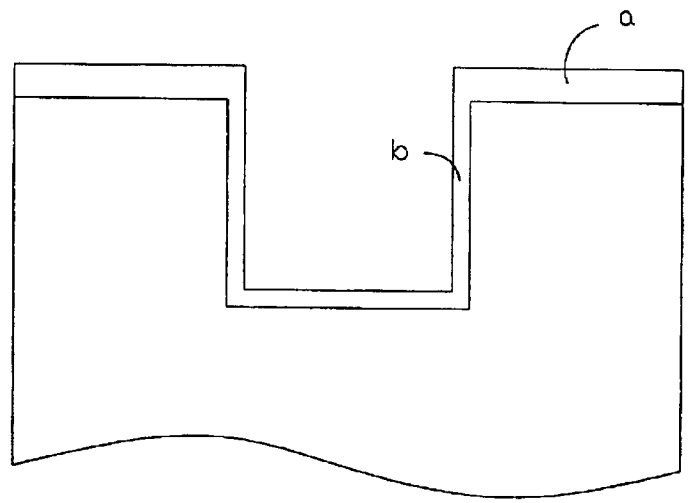
FIG. 1 shows cross-sectional views illustrative of depositing the nucleation layer on the top (with the plasma process) and the sidewall (without the plasma process) of the via hole in accordance with the conventional process.
Figure 2A:
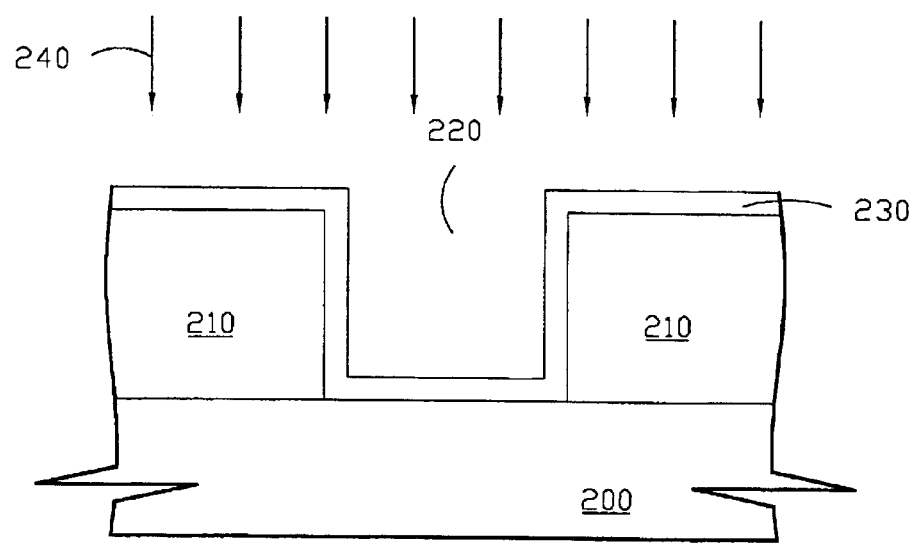
FIG. 2A to FIG. 2C show cross-sectional views illustrative of various stages for forming the continuous metal seed layer (CMSL) by way of an atomic layer deposition (ALD) in accordance with the first embodiment of the present invention.
Figure 2B:
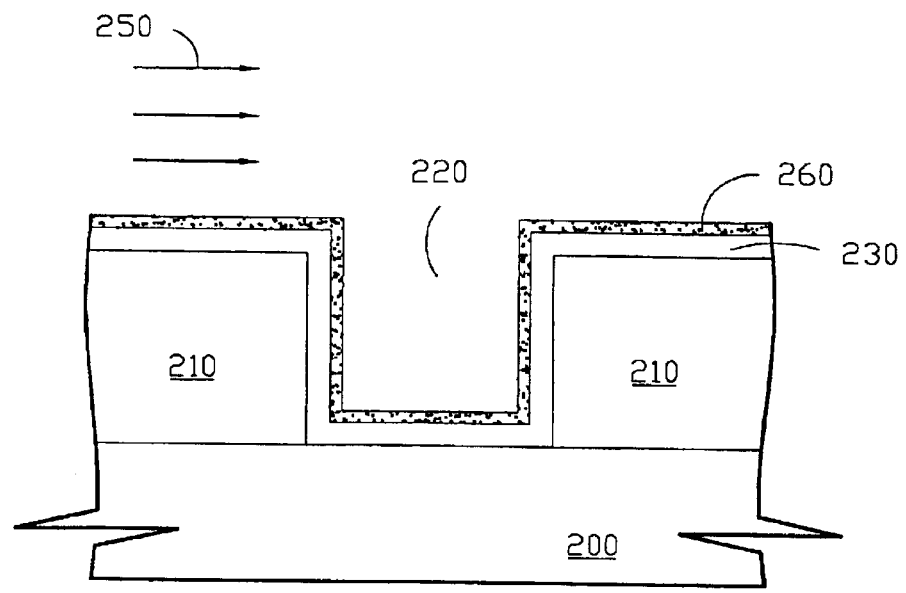
Figure 2C:
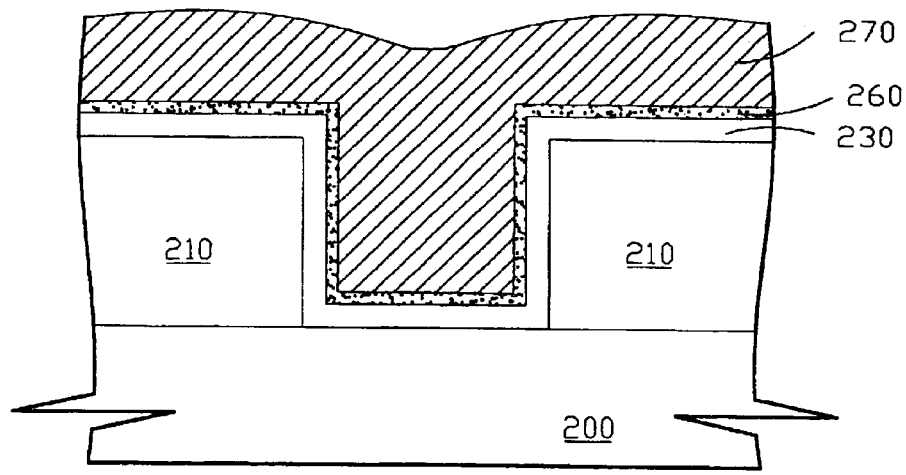

As illustrated in FIG. 2A to FIG. 2C, in the first embodiment of the present invention, a semiconductor substrate 200 having a dielectric layer 210 is provided. There is a via hole 220 in the dielectric layer 210, and a barrier layer 230 is formed on the dielectric layer 210 and sidewall and bottom of the via hole 220, wherein the method for forming the barrier layer 230 comprises a metal organic chemical vapor deposition (MOCVD). Then the barrier layer 230 is treated by way of using a plasma process 240. Afterward, an atomic layer deposition (ALD) 250 is performed at least one time to form a continuous metal seed layer (CMSL) 260 on the barrier layer 230, wherein the cycle step of the atomic layer deposition (ALD) 250 comprises: a mixing gas of hydrogen and silane, such as hydroxy silane or tetrahydroxy silane, is transported on the barrier layer; next, a purge/vacuum process is performed; then a reactive gas having a metal is transported to form the continuous metal seed layer(CMSL) 260; the cycle step of the atomic layer deposition(ALD) 250 can be repeated to form the thickness of the continuous metal seed layer (CMSL) 260 about 20 to 40 Å. Finally, a blanket metal layer 270 is formed on the continuous metal seed layer (CMSL) 260.

Figure 3A:
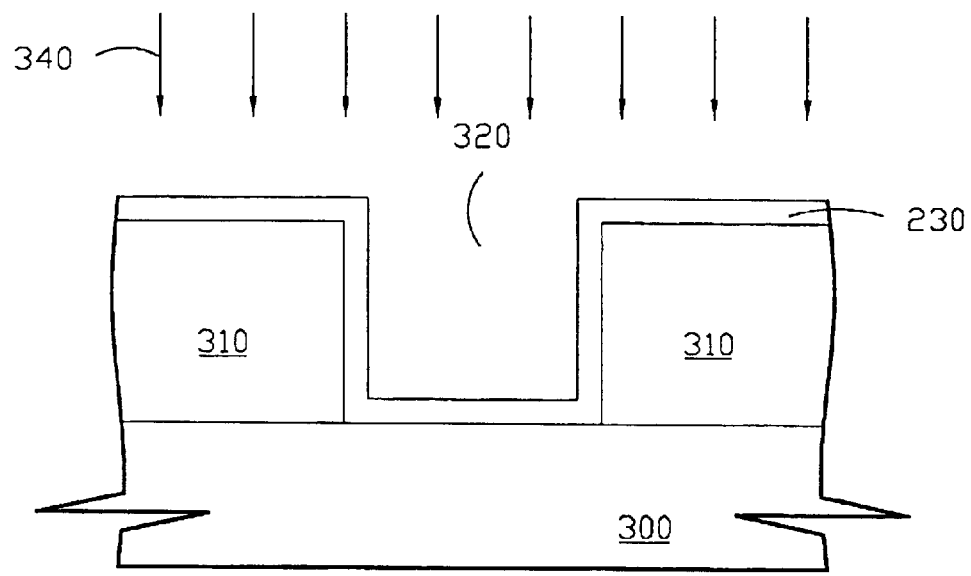
FIG. 3A to FIG. 3C show cross-sectional views illustrative of various stages for forming the continuous metal seed layer (CMSL) by way of an atomic layer deposition (ALD) in accordance with the second embodiment of the present invention.
Figure 3B:
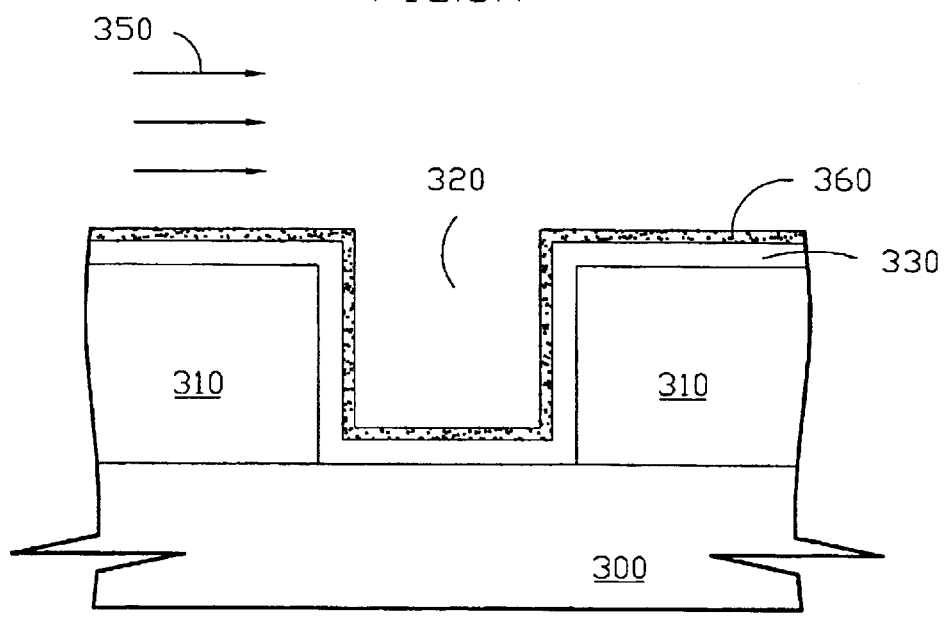
Figure 3C:
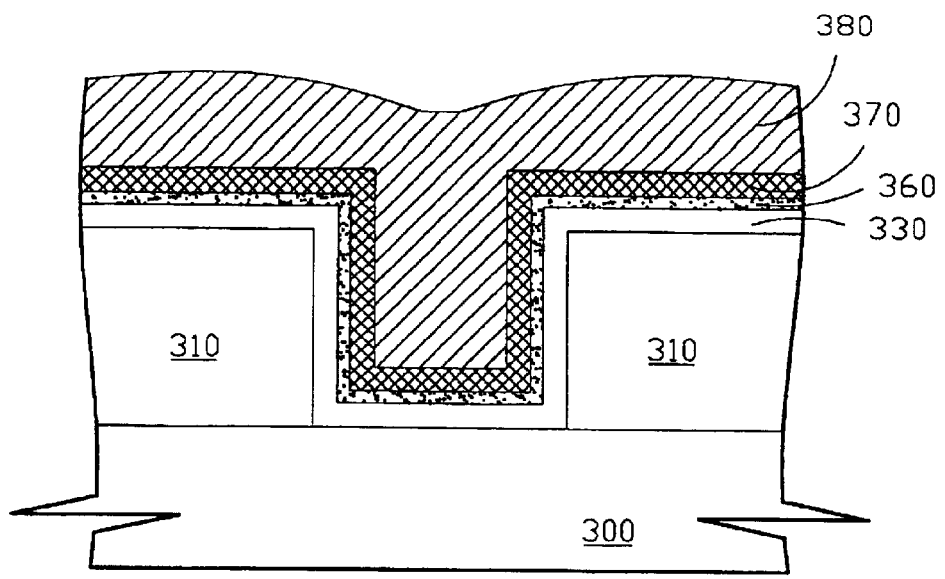

As illustrated in FIG. 3A to FIG. 3C, in the second embodiment of the present invention, a semiconductor substrate 300 having a dielectric layer 310 is provided. There is a via hole 320 in the dielectric layer 310. A barrier layer 330 is formed on the dielectric layer 310, the sidewall and the bottom of the via hole 320. The method for forming the barrier layer 330 comprises a metal organic chemical vapor deposition (MOCVD) and a physical vapor deposition (PVD). Then the barrier layer 330 is treated by way of a plasma process 340. Afterward, an atomic layer deposition (ALD) 350 is performed at least one time to form a continuous metal seed layer (CMSL) 360 on the barrier layer 330, wherein the cycle step of the atomic layer deposition (ALD) 350 comprises: a mixing gas of hydrogen and silane, such as hydroxy silane or tetrahydroxy silane, is transported on the barrier layer; next, perform a purge/vacuum process to remove unnecessary matters after the mixing gas is absorbed on the barrier layer 330; then a reactive gas having a metal is transported to form the continuous metal seed layer (CMSL) 360; the cycle step of the atomic layer deposition (ALD) 350 can be repeated to form the thickness of the continuous metal seed layer (CMSL) 360 about 20 to 40 Å. Afterward, a metal nucleation layer 370 is formed on the continuous metal seed layer(CMSL) 360. Finally, form a blanket metal layer 380 on the metal nucleation layer 370 by way of a chemical vapor deposition (CVD).

Figure 4A:
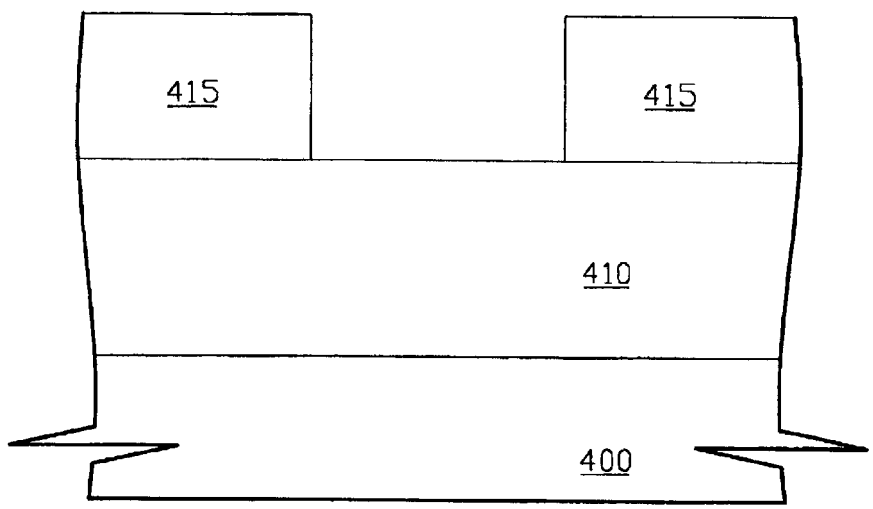
Figure 4B:
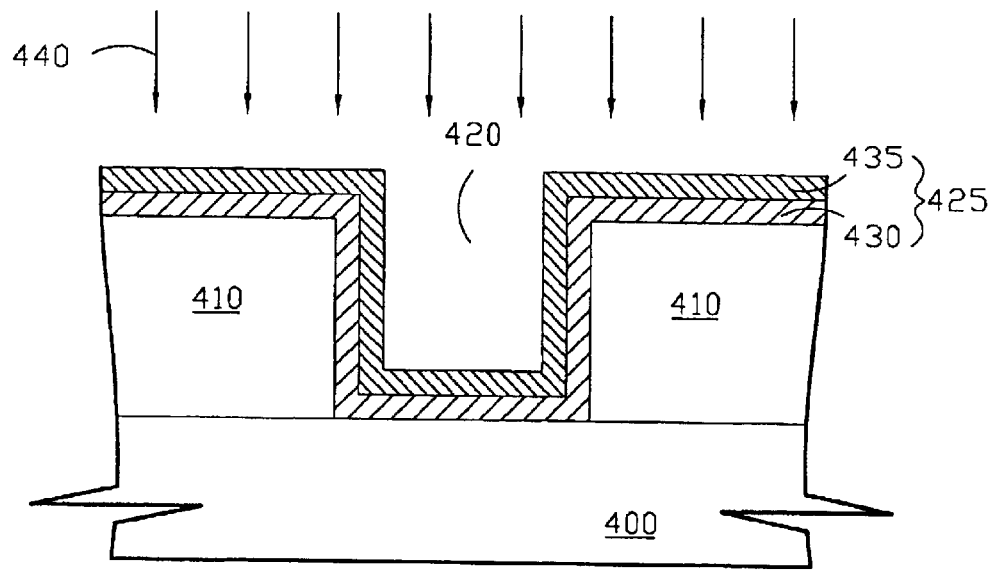
Figure 4C:
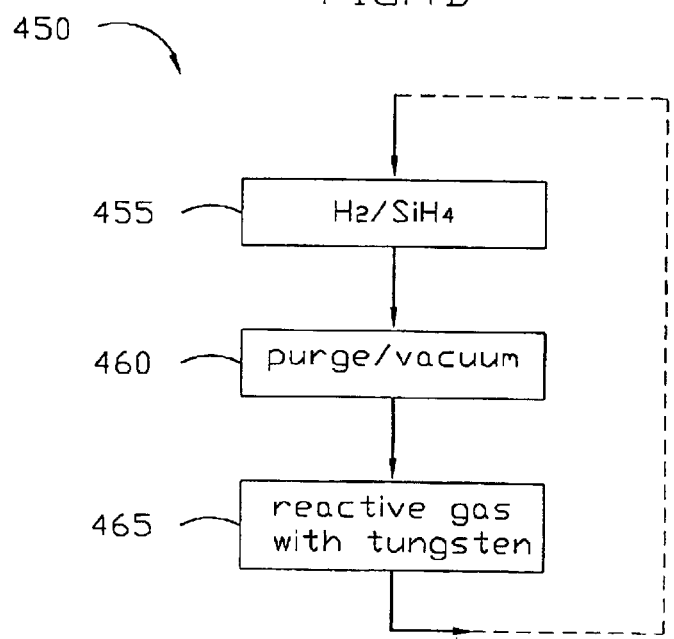
Figure 4D:
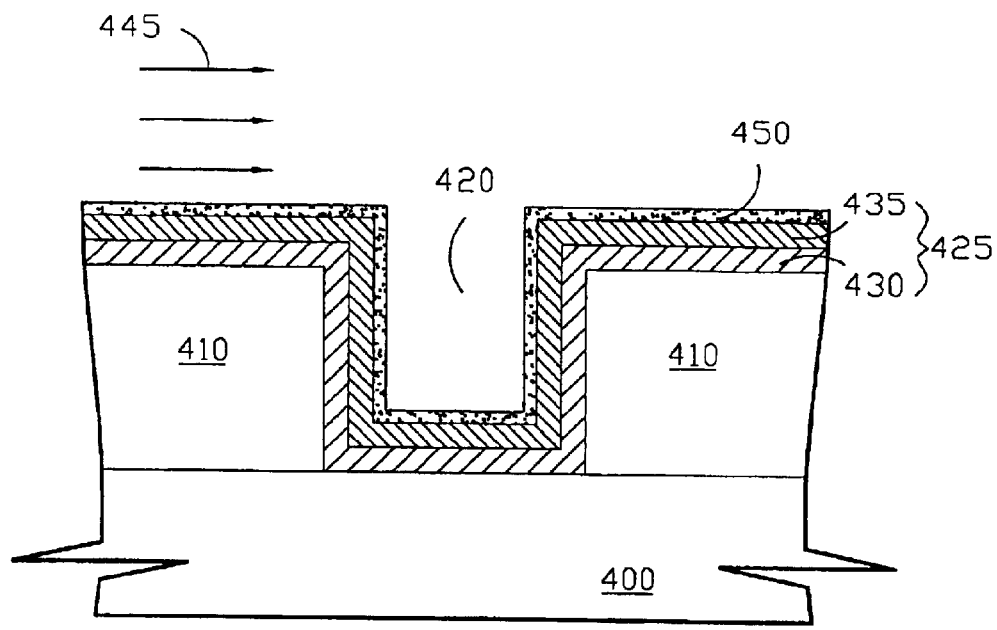
Figure 4E:
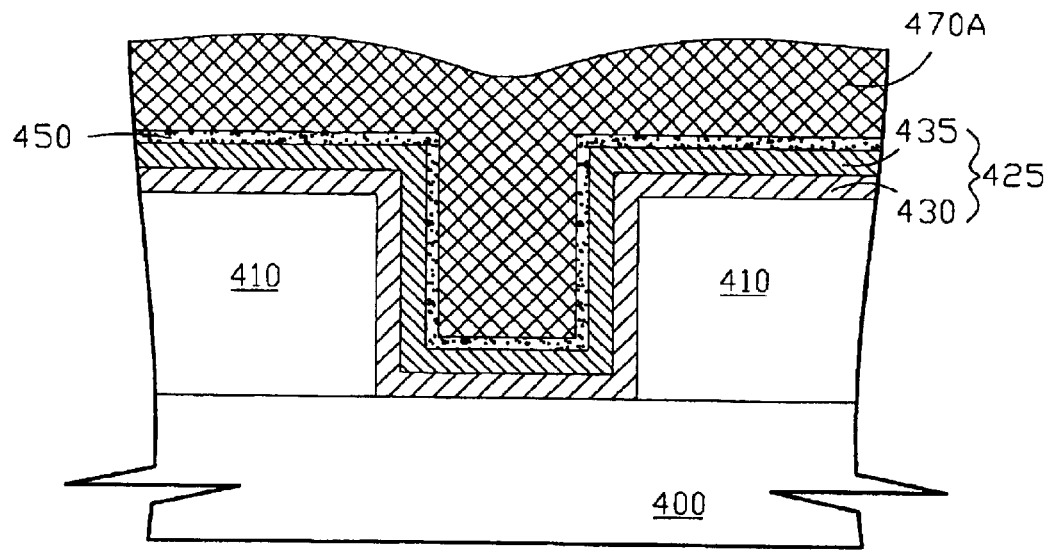
Figure 4F:
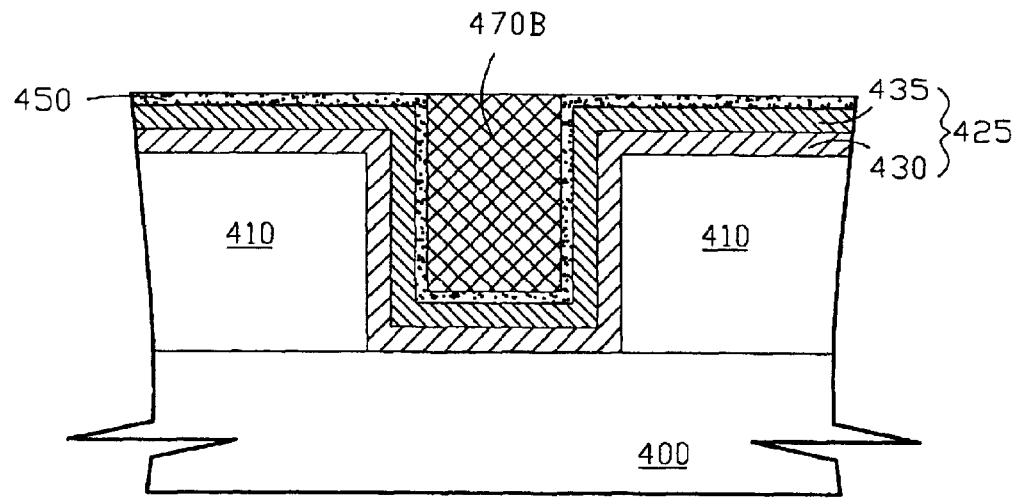

As illustrated in FIG. 4A and FIG. 4B, in the third embodiment of the present invention, first of all, a semiconductor substrate 400 is provided. Then a dielectric layer 410 is formed on the semiconductor substrate 400. Next, a photoresist layer 415 is formed and defined on the dielectric layer 410. An etching process is then performed by the photoresist layer 415 as an etched mask to form a via hole 420 in the dielectric layer 410. After removing the photoresist layer 415, a barrier layer 425 is formed on the dielectric layer 410, the sidewall and bottom of the via hole 420, wherein the method for forming the barrier layer 425 comprises: a titanium layer 430 is conformed on the dielectric layer 410 and the sidewall and bottom of the via hole 420 by way of using a depositing process; perform a metal organic chemical vapor deposition (MOCVD) to conform a nitride titanium layer (MOCVD-TiN) 435 on the titanium layer 430, whereby Ti/MOCVD-TiN (430/435) stack the barrier layer 425. Afterward, the barrier layer 425 is treated by way of using a plasma process, wherein the plasma process comprises a nitrogen plasma process.

FIG. 4C to FIG. 4F illustrate the steps of performing an atomic layer deposition (ALD) 445 at least once to form a continuous tungsten seed layer (CWSL) 450 on the barrier layer 425, wherein the cycle step of the atomic layer deposition (ALD) 445 comprises: a mixing gas 455 of hydrogen and silane, such as hydroxy silane or tetrahydroxy silane, is first transported on the barrier layer 425, the mixing gas 455 is absorbed on the barrier layer 425; next, perform a purge/vacuum process 460 to remove unnecessary matters after the mixing gas 455 is absorbed on the barrier layer 425; then a reactive gas 465 having a tungsten, such as $WF_6$, is transported to form a mono-seed layer with tungsten by a mono-layer substitution reaction that reacts with the reactive gas 465 and the mixing gas 455 on the barrier layer 425; the cycle step of the atomic layer deposition (ALD) 445 can be repeated to form the thickness of the continuous metal seed layer (CMSL) 450 about 20 to 40 Å, wherein the continuous metal seed layer (CMSL) 450 gets much better step coverage, that would get lower and stable resistance constant (RC) with the barrier layer 425, further, the selectivity for forming the tungsten can be raised to about 100%. Afterward, a tungsten layer 470A is formed on the continuous tungsten seed layer (CWSL) 450. Finally, the tungsten layer 470A is etched back to form a plug tungsten layer 470B in the via hole 420.

Figure 5A:
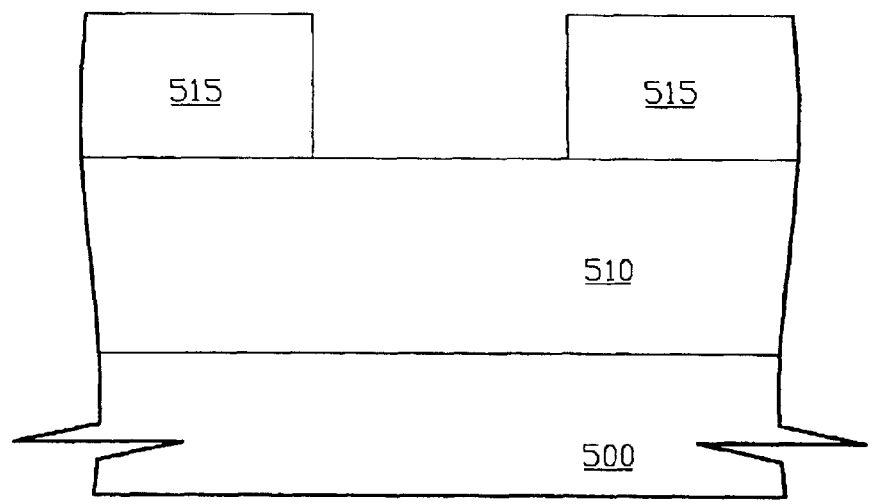
Figure 5B:
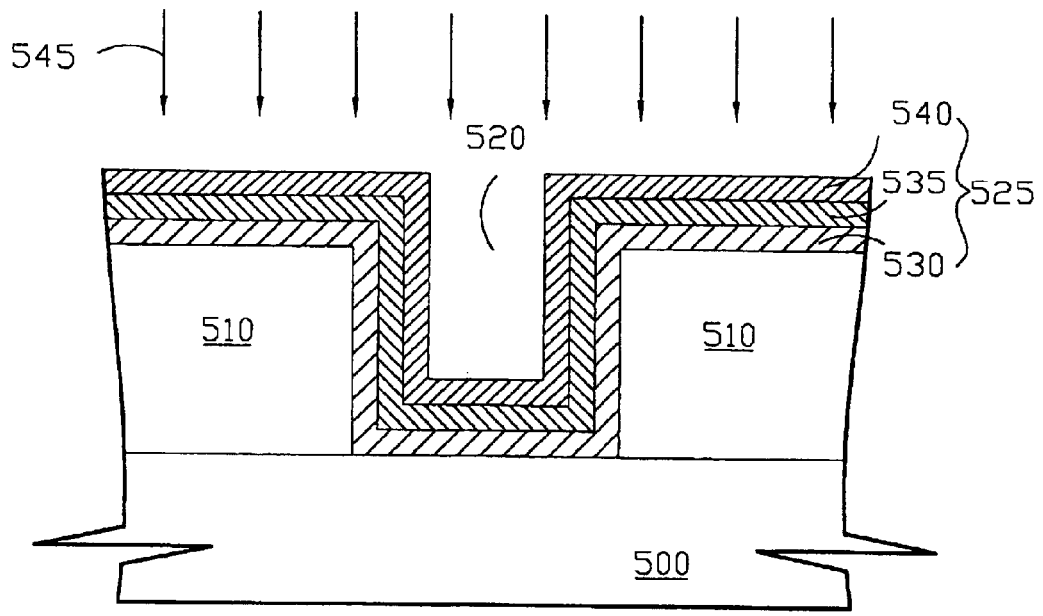
Figure 5C:
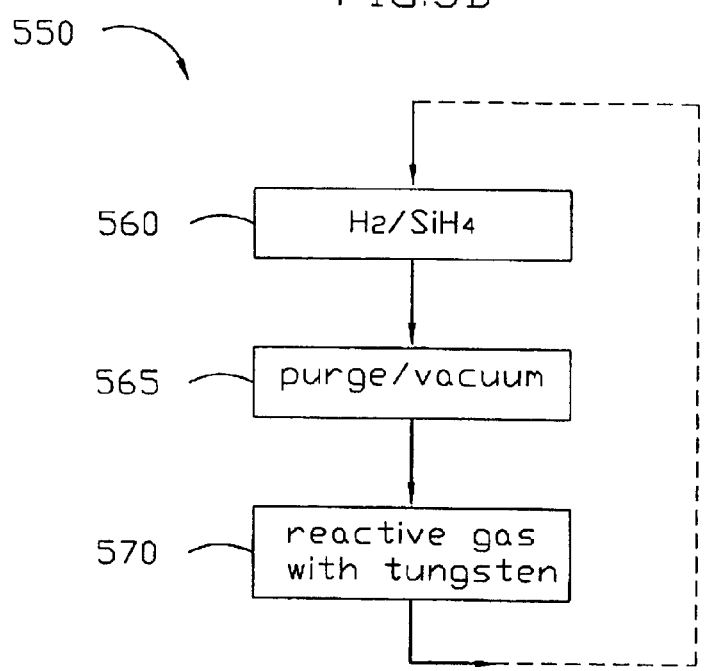
Figure 5D:
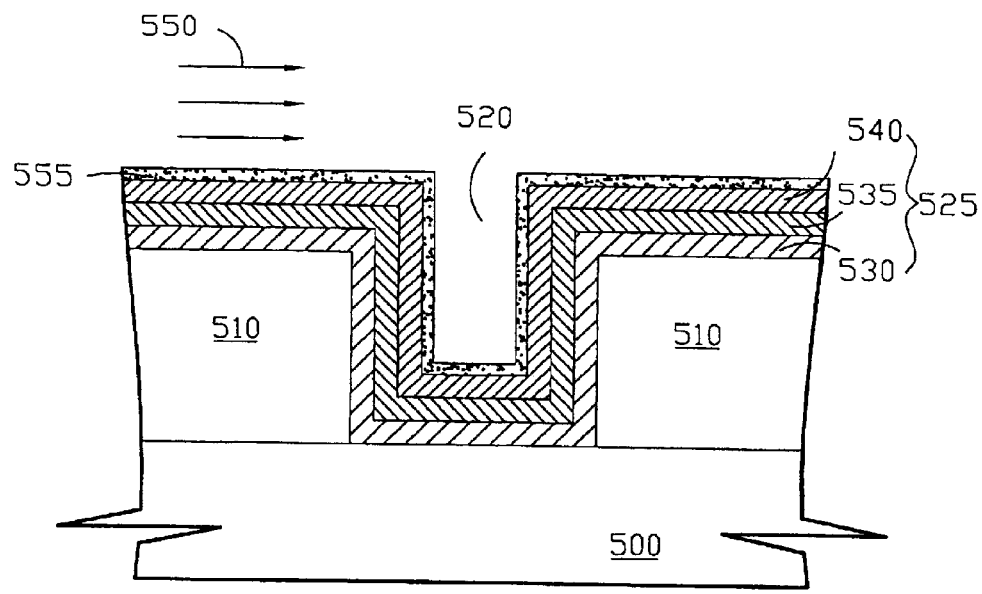
Figure 5E:
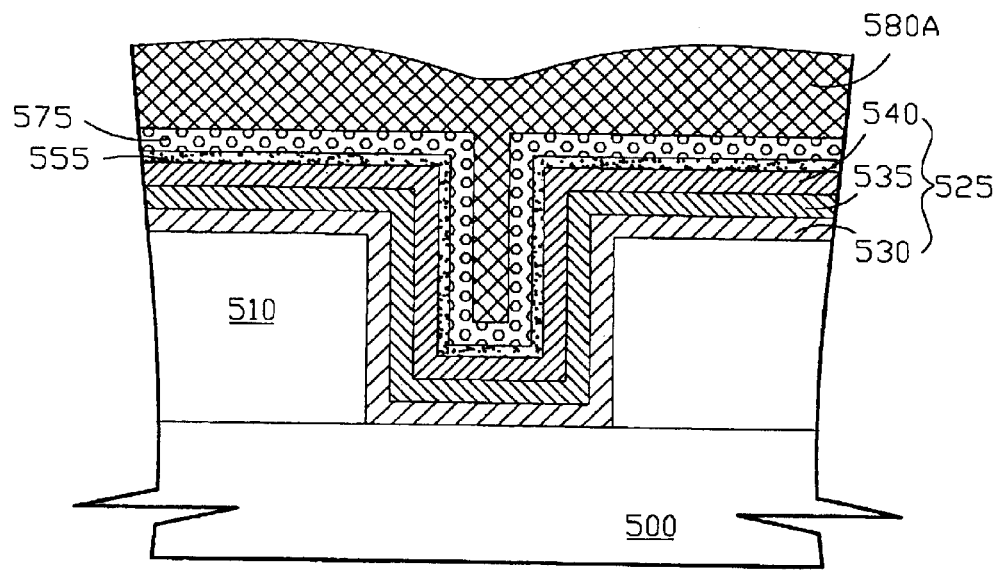
Figure 5F:
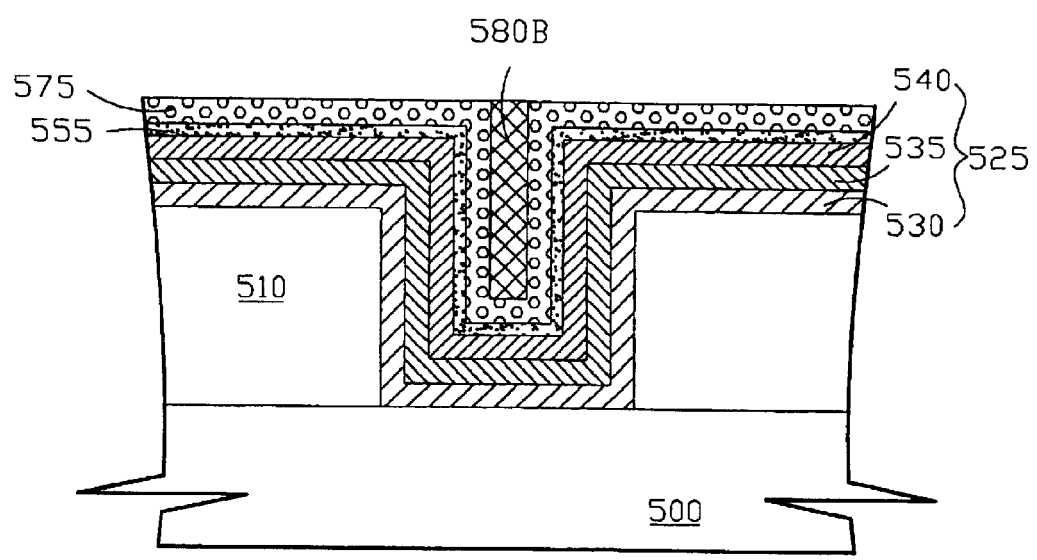

As illustrated in FIG. 5A and FIG. 5B, in the third embodiment of the present invention, first of all, a semiconductor substrate 500 is provided. Then a dielectric layer 510 is deposited on the semiconductor substrate 500. Next, a photoresist layer 515 is formed and defined on the dielectric layer 510. An etching process is then performed by the photoresist layer 515 as an etched mask to form a via hole 520 in the dielectric layer 510. After removing the photoresist layer 515, a barrier layer 525 is formed on the dielectric layer 510 and the sidewall and bottom of the via hole 520, wherein the method for forming the barrier layer 525 comprises: a titanium layer 530 is conformed on the dielectric layer 510 and the sidewall and bottom of the via hole 520 by way of using a depositing process; perform a metal organic chemical vapor deposition (MOCVD) to conform a first nitride titanium layer (MOCVD-TiN) 535 on the titanium layer 530; a second nitride titanium layer (PVD-TiN) 540 is formed on the first nitride titanium layer (MOCVD-TiN) 535 by way of using a physical vapor deposition (PVD), whereby the Ti/MOCVD-TIN/PVD-TiN (530/535/540) stack the barrier layer 525. Afterward, the barrier layer 525 is treated by way of using a plasma process, wherein the plasma process comprises a nitrogen/hydrogen plasma process.

As illustrated in FIG. 5C to FIG. 5F, in this embodiment, perform an atomic layer deposition (ALD) 550 at least once to form a continuous tungsten seed layer (CWSL) 555 on the barrier layer 525, wherein the cycle step of the atomic layer deposition (ALD) 550 comprises: a mixing gas 560 of hydrogen and silane, such as hydroxy silane or tetrahydroxy silane, is first transported on the barrier layer 525, so as to absorb the mixing gas 560 on the barrier layer 525; next, perform a purge/vacuum process 565 to remove unnecessary matters or the remainder after the mixing gas 565 is absorbed on the barrier layer 525; then a reactive gas 570 with a $WF_6$ is transported on said barrier layer 525 having said mixing gas to form a mono-seed layer with tungsten by a mono-layer substitution reaction that reacts with the reactive gas 570 and the mixing gas 560 on the barrier layer 525; the cycle step of the atomic layer deposition (ALD) 550 can be repeated to form the thickness of the continuous tungsten seed layer(CWSL)555 about 20 to 40 Å, wherein the continuous tungsten seed layer (CWSL) 555 gets much better step coverage, that would get lower and stable resistance constant (RC) with the barrier layer 525, further, the selectivity for depositing the tungsten can be raised to about 100%. Afterward, a nucleation layer 575 is formed on the continuous tungsten seed layer (CWSL) 555. Subsequently, a tungsten layer 580A is formed on the nucleation layer 575 by way of a chemical vapor deposition (CVD). Finally, the tungsten layer 580A is etched back by way of a chemical mechanical polishing process to form a plug tungsten layer 580B in the via hole 520.

In these embodiments of the present invention, as discussed above, this invention can perform an atomic layer deposition (ALD) to form a continuous metal seed layer (CMSL) on the barrier, so as to raise the selectivity for depositing the metal. Furthermore, the absorption rate of the reactive gas with the metal is greater than the same one of the mixing gas with the hydrogen/silane. If both gases are transported at the same time, the reactive gas with the metal will be absorbed first on the barrier layer. Hence, the substitution reaction is difficult to react with the reactive gas and the mixing gas, it will result in an uncontinuous and insufficient nucleation sites. Accordingly, in this invention, firstly, cycle step of the atomic layer deposition (ALD) transport the mixing gas, so as to absorb the mixing gas on the barrier layer, and then transport the reactive gas to proceed the substitution reaction with the mixing gas on the barrier layer, whereby the issue of the competitive adsorption can be prevented to perform the substitution reaction completely. Therefore, this invention can provide continuous and high-density nucleation sites.

Moreover, this invention can raise the depositing selectivity in the follow-up process for depositing the metal to about 100%. A thin continuous metal seed layer (CMSL) about 20 to 30 Å is only necessary for this invention to avoid a thick nucleation layer from forming at about 500 Å, this is due to the uncontinuous and insufficient nucleation sites in the conventional process. On the other hand, the continuous metal seed layer (CMSL) by this invention is also able to substitute for the thick nucleation layer by a conventional process, and that can make a direct deposit of the metal layer thereon, so that the integrity of the cap-filling process is maintained. Therefore, the present invention makes cost reductions that correspond to economic effect and is appropriate for deep sub-micron technology.

Of course, it is possible to apply the present invention to form the tungsten layer with the chemical vapor depositing process, and to any process for forming the plug metal layer in the process of the semiconductor devices. Also, this invention can be applied to form the continuous metal seed layer (CMSL) with the thin thickness by the atomic layer deposition (ALD) concerning the increase of the nucleation sites used for forming the plug tungsten layer which has not been developed at present. The method of the present invention is the best process for forming the plug metal layer compatible process for the deep sub-micro process.

Obviously, many modifications and variations of the present invention are possible in light of the above teachings. It is therefore to be understood that within the scope of the appended claims, that the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for forming a metal layer, the method comprising:

providing a semiconductor substrate with a barrier layer, wherein said barrier layer has a nitride titanium layer that is firmed by way of using a metal organic chemical vapor deposition;

performing an atomic layer deposition at least one time to form a continuous metal seed layer on said barrier layer by steps comprising:

transporting mixing a gas having a hydrogen and a saline on said barrier layer;

performing a vacuum process; and transporting a reactive gas having a metal to form said continuous metal seed layer on said barrier layer;

forming a nucleation layer with metal on said continuous metal seed layer; and forming said metal layer on said nucleation layer with metal.

2. The method according to claim 1, wherein said barrier layer comprises a titanium layer.

3. The method according to claim 1, wherein said reactive gas comprises a fluoride gas.

4. The method according to claim 3, wherein said fluoride gas comprises a $WF_6$.

5. The method according to claim 1, wherein said metal layer comprises a tungsten.

6. A method for forming a plug metal layer, the method comprising:

providing a semiconductor substrate with a dielectric layer thereon;

forming a via hole in said dielectric layer;

forming a barrier layer on said dielectric layer and the sidewall and bottom of said via hole;

treating said barrier layer by way of using a plasma process;

performing an atomic layer deposition at least one time to form a continuous metal seed layer that has a thickness about 20 to 40 Å on said barrier layer by steps comprising:

transporting a mixing gas having a hydrogen and a saline on said barrier layer;

performing a vacuum process; and transporting a reactive gas having a metal to form said continuous metal seed layer on said barrier layer;

forming a nucleation layer on said continuous metal seed layer;

and performing a chemical vapor depositing process to form said plug metal layer on said nucleation layer.

7. The method according to claim 6, wherein the method for forming said barrier layer comprises;

conforming a titanium layer on said dielectric layer and the sidewall and the bottom of said via hole;

performing a metal organic chemical vapor deposition to form a first nitride titanium layer on said titanium layer; and forming a second nitride titanium layer on said first nitride titanium layer by way of using a physical vapor deposition to form said barrier layer.

8. The method according to 6, wherein said plasma process comprises a nitrogen plasma process.

9. The method according to claim 6, wherein said reactive gas comprises a $WF_6$.

10. The method according to claim 6, wherein the material of said plug metal layer comprises a tungsten.

* * * * *